March 7, 1950 W. L. DUNN 2,499,573

SIGNAL-SEEKING TUNER

Filed Nov. 5, 1945

INVENTOR.
WILLIAM L. DUNN
BY Mueller, Dodds & Mason
ATTORNEYS

Patented Mar. 7, 1950

2,499,573

UNITED STATES PATENT OFFICE 2,499,573

SIGNAL-SEEKING TUNER

William L. Dunn, Glenview, Ill., assignor to Belmont Radio Corporation, a corporation of Illinois Application November 5, 1945, Serial No. 626,679

8 Claims. (Cl. 250—40)

Figures 1, 2, 3:
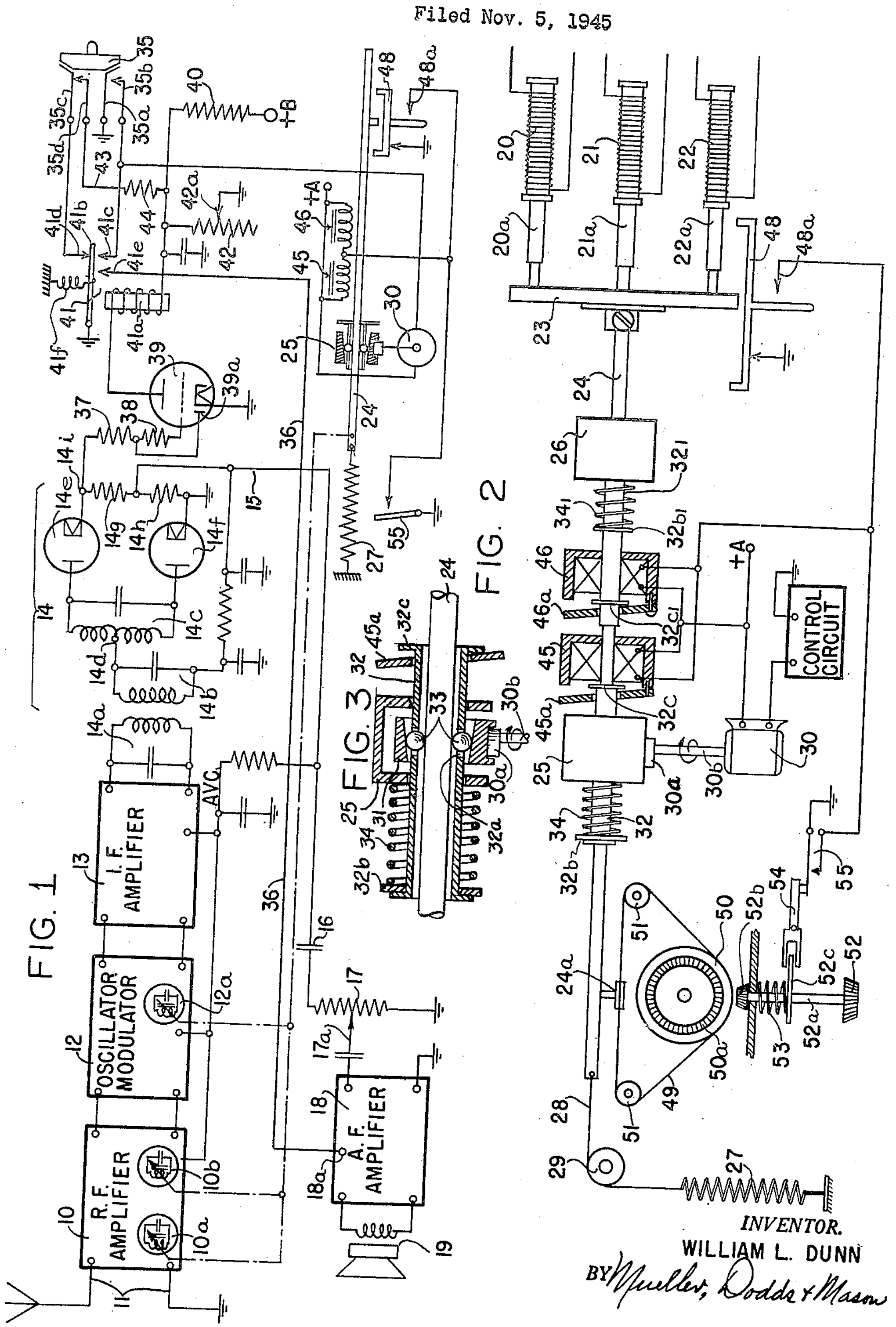

This invention relates to signal-seeking tuners and more particularly to such tuners for radio broadcast receivers of the type which sweeps over the tuning range until a station is reached from which the signal is above a predetermined minimum acceptable signal strength, and which rests in such position.

In certain broadcast receivers it is desirable to procure the ease of tuning characteristic of push-button tuning apparatus while at the same time it is desired to avoid the presetting feature characteristic of such tuners. For example, in the case of automobile receivers the tuning of the local stations of greatest signal strength varies from place to place so that it becomes impracticable to set up a push-button tuner in such a way as to be useful as a car is driven over considerable distances.

It is an object of the invention, therefore, to provide a new and improved tuner for a radio broadcast receiver which has the ease of tuning of conventional push-button tuners but does not require any presetting operations.

It is another object of the invention to provide a new and improved tuner for radio broadcast receivers of the signal-seeking type; that is, a tuner in which one operation of a push-button will cause the tuner to seek a signal of acceptable field strength and to hold on to such station until the push-button is operated a second time, when the cycle is repeated.

In accordance with the invention, an automatic signal-seeking tuner for a radio receiver comprises an adjustable tuning apparatus for the receiver, power means for actuating the tuning apparatus, manually operable means for initiating operation of the power means, and means responsive to the reception of a signal by the receiver for arresting the actuation of the tuning apparatus. Preferably the tuner includes also an interlocking means interconnecting the manually operable means and the signal-responsive means for limiting the latter to a single operation after each operation of the manually operable means.

For a better understanding of the invention together with other and further objects thereof, reference is had to the following specifications taken in conjunction with the drawings, while its scope will be pointed out in the appended claims.

Referring now to the drawing, Fig. 1 is a circuit diagram, partially schematic, of a complete signal-seeking tuner for a radio broadcast receiver and embodying the invention; Fig. 2 is a schematic representation of the physical construction of the signal-seeking tuner of Fig. 1; while Fig. 3 is a detailed view of the driving connection from the driving motor to the tuning apparatus.

Referring now to Fig. 1 of the drawing, there is represented a complete radio-broadcast receiver including an automatic signal-seeking tuner embodying the invention. This receiver comprises a radio-frequency amplifier unit 10 having input terminals connected to an antenna-ground circuit 11 and output terminals connected to an oscillator-modulator unit 12. This latter unit is in turn connected to an intermediate-frequency amplifier 13, a frequency discriminator 14, described in more detail hereinafter, a portion of which serves also as a modulation detector. The detected modulation signal is applied by way of a circuit 15 and a coupling condenser 16 to a volume control resistor 17 having an adjustable contact 17a, which in turn is connected through an audio-frequency amplifier 18 to a signal reproducer such as a loud speaker 19. An automatic amplification control or AVC bias is also derived from the circuit 15 and applied, as indicated, to one or more of the vacuum tubes of the units 10, 12 and 13 to maintain the amplitude of the signal input to the frequency discriminator 14 approximately constant for wide range received signal intensities. The radio-frequency amplifier 10 is provided with input and output tuning units schematically represented at 10a and 10b, respectively, while the oscillator-modulator unit is provided with an adjustable tuning unit 12a.

The radio receiver described, per se, forms no part of the present invention and operates in accordance with conventional principles so that a detailed description of its operation is deemed unnecessary. In brief, however, signals intercepted by the antenna system 11 are selected and amplified in the unit 10, converted in the unit 12 into intermediate frequency signals, further selected and amplified in the unit 13, and detected in the unit 14 to derive the modulation signal. This signal is impressed upon the audio-frequency amplifier 18 wherein it is further amplified and applied to the loud speaker 19 for reproduction. The AVC connection from the unit 14 serves to maintain the average signal input to the unit 14 approximately constant and thereby avoids overload of the receiver for strong signals, while providing maximum amplification for weak signals.

The automatic signal-seeking tuner of the invention is shown schematically in Fig. 1 and in more detail in Fig. 2. In general, this tuner comprises adjustable tuning apparatus for the receiver indicated schematically as the tuning units 10a and 10b included in a radio-frequency amplifier 10 and the tuning unit 12a in the oscillator-modulator 12. While the tuning apparatus may be of any desired type, there is illustrated by way of example tuning units comprising an adjustable-permeability inductor in parallel with a fixed capacitor. As shown in Fig. 2 the inductors for the tuning units 10a, 10b and 12a are represented at 20, 21, and 22, respectively, provided with adjustable ferro-magnetic cores 20a, 21a and 22a, respectively, supported from a common reciprocating yoke 23. The yoke 23 is securely mounted on an elongated operating shaft 24 longitudinally adjustable in bearings or housings 25 and 26. This tuning apparatus includes also means for biasing it to one extreme position, for example, a tension spring 27 connected to one end of the shaft 24 by way of a flexible line 28 passing over an idler pulley 29.

The tuning apparatus also includes power means, such as an electric motor 30 energized from suitable source +A, which may be the cathode heater supply for the receiver, for actuating said tuning apparatus against the biasing spring 27 in only a single direction from one of its extreme positions. The motor 30 is energized from source +A through a control circuit to be described and represented schematically in Fig. 2. The motor 30 may be connected to drive the shaft 24 in any suitable manner, for example, by way of an "inching" drive shown in more detail in Fig. 3. Essentially this comprises an eccentric 30a mounted on the end of the shaft 30b of the motor and engaging a slotted collar 31 surrounding and movable axially of the shaft 24. The inner surface of the collar 31 is conically tapered, as shown, and forms with the shaft 24 an annular recess. Within this recess is mounted an axially movable elongated annular sleeve 32 having a plurality of peripheral apertures 32a in which are mounted ball bearings 33. One end of the sleeve 32 is provided with a radially outwardly extending flange 32b which is engaged by a compression spring 34 acting against the housing 25 to bias the sleeve 32 to the left as shown in Figs. 2 and 3 and thus wedge the ball bearings between the collar 31 and the shaft 24 to provide a frictional driving engagement therebetween.

The tuning apparatus of the invention includes also manually operable means for initiating operation of the power means, which may be in the form of a manually operable push-button switch 35 having normally open contacts 35a and 35b in circuit with the motor 30 and auxiliary normally closed contacts 35c and 35d. The apparatus also includes brake means for restraining the tuning apparatus from movement under the influence of the biasing spring 27. The driving unit 25 described above in itself constitutes a brake means when the motor 30 is de-energized by virtue of the biasing of the sleeve 32 to a braking position by means of the spring 34. The unit 26 supporting the shaft 24 comprises additional braking means which may be identical to that of unit 25 except that there is no provision for reciprocating the collar 31 to actuate the drive shaft 24. The unit 26 also includes a biasing spring $34_1$ acting on the flange $32b_1$ of the brake sleeve $32_1$. The receiver also includes means for normally quieting the receiver except when it is tuned to a desired station of acceptable signal strength. This may comprise a connection 18a to audio-frequency amplifier 18 by way of a circuit 36 adapted to be grounded by a control means to be described and thus mute the amplifier 18.

The signal-seeking tuner further includes control means responsive to the reception of a signal of a predetermined value by the receiver, only upon tuning through the signal, for arresting the actuation of the tuning apparatus, as by setting the brake means, and for rendering the quieting means ineffective. This control means comprises the frequency-responsive discriminator network 14 described above, connected to translate a received signal and effective to develop a control signal. The discriminator 14 comprises a primary tuned circuit 14a coupled to a secondary tuned circuit 14b and a tertiary tuned circuit 14c also coupled to the primary circuit 14a and provided with an electrical midpoint 14d to which is applied a signal from the secondary circuit 14b. The sum and difference of the secondary and tertiary signals are rectified by discriminator diodes 14e and 14f connected across the tertiary winding 14c and provided with individual load resistors 14g and 14h. The detected modulation signal is derived from the resistor 14h and impressed upon the volume control resistor 17, as described above. The control signal or output signal of the discriminator 14 is derived at the terminal 14i and applied through grid resistors 37 and 38 to the control grid of a control-signal amplifier tube 39. As is well understood, the control signal developed at the terminal 14i of the discriminator 14 has the usual S-characteristic which reverses polarity as the receiver is tuned through the center of the channel of the station being received. Since the actuating means for the tuning apparatus operates in only a single direction, it is desirable that this actuation should not be interrupted until the tuning apparatus is adjusted to the center of the channel; that is, it is desired that the portion of the control signal developed while tuning toward the center of the channel be made ineffective. To this end, there is provided means for suppressing the portion of the control signal developed while tuning toward a received signal whereby there is developed a control signal only during tuning through and away from a received signal. This means comprises a connection from the junction of resistors 37 and 38 to an auxiliary diode anode 39a of tube 39.

The control means of the tuning apparatus also includes means for utilizing the control signal developed as described. This means may comprise an electromagnetic relay 41 having a winding 41a controlled or energized jointly in response to the control signal developed by discriminator 14 and the manually operable switch 35. Specifically, the winding 41a is energized from a suitable source +B through a load resistor 40 and the vacuum tube 39. The relay 41 includes a movable contact element 41b biased by a spring 41f to form with a stationary contact 41c normally open hold-in contacts in parallel with the contacts 35a, 35b of the switch 35, to form with a stationary contact 41e, normally open muting contacts controlling the muting circuit 36; and to form with a stationary contact 41d normally closed interlocking contacts in series with the normally closed contacts 35c, 35d of the switch 35. In parallel with the winding 41a of the relay and the tube 39 is a resistor 42 having an adjustable contact 42a connected to ground and comprising means for adjusting the electrical responsive means, that is the relay 41 to respond to received signals of different predetermined values.

The control means of the signal-seeking tuner also includes interlocking means interconnecting the manually operable switch 35 and the signal responsive relay 41 for rendering the latter nonresponsive after a single operation until a subsequent operation of the manually operable means. This interlocking means is in the form of an interlocking circuit 43, connecting the high-potential terminal of the winding 41a to ground through a resistor 44, the normally closed contacts 35c, 35d of switch 35, and normally closed contacts 41b, 41d of the relay 41, thus reducing the energization of the relay below an operating value.

The tuner further includes means responsive to adjustment of the tuning apparatus to its other extreme position, that is the opposite extreme of its range of adjustment by the motor 30 against the biasing spring 27, for initiating return thereof to its initial extreme position under the influence of the biasing spring 27. This means may be in the form of a limit switch 48 adapted to be actuated by a member movable with the shaft 24, for example the yoke 23 as indicated in Fig. 2. The switch 48 is grounded, as illustrated, and is provided with a normally open fixed contact 48a which is adapted to be closed, and thus grounded, only when the actuating shaft 24 of the tuning apparatus reaches its extreme right-hand position as shown in the drawings. The limit switch 48 may be of conventional construction and, after actuation as described, is adapted to maintain its contact 48a closed until the tuning apparatus reaches its opposite extreme position, whereupon the contact is again opened.

The signal-seeking tuner further includes means for manually adjusting the tuning apparatus and for simultaneously freeing the same from actuation by the motor 30 and from the brakes 25, 26. To this end, the tuning shaft 24 is connected by way of a clamp 24a to an endless belt or strand 49 passing around a driving pulley or drum 50 and a pair of idler pulleys 51, 51. It will be understood that a suitable indicating apparatus may be connected either with the endless strand 49 for cooperation with a linear indicating scale or with the drum 50 for cooperation with a circular indicating scale. The drum 50 is provided with an annular frictional driving surface 50a and there is provided manually operable means such as a tuning knob 52 mounted on a shaft 52a and terminating in a frictional driving element 52b engageable with the frictional driving element 50a for adjusting the drum 50 and the tuning apparatus. The tuning knob 52 and shaft 52a are axially adjustable and are normally biased by means of a spring 53 so that the driving member 52b is maintained out of engagement with the annular driving member 50a. The tuning shaft 52a carries an extension 52c which, through a pivoted arm 54, engages the normally open contacts of a switch 55 connected in parallel with the contact 48a in the circuit of the brake magnets 45 and 46 and comprising means actuated by the engagement of the manual tuning element with the drum 50 for energizing the brake magnets to release the brakes and free the tuning apparatus from actuation by the driving motor 30 and from restraint by the brakes 25 and 26.

In considering the operation of the signal-seeking apparatus described, it will be assumed that initially the several control switches are in the positions illustrated in the drawing and that the receiver is not tuned to a station of acceptable signal strength. Under these conditions the brake magnets 45 and 46 are de-energized, the interlocking circuit 43 of the relay winding 41 is closed through the contacts 35c, 35d and 41b, 41d so that the relay 41 is unresponsive to control signals from the discriminator 14 while the energizing circuit of the motor 30 is open at the contacts 35a, 35b and 41b, 41c in parallel. If now the automatic push-button switch 35 is momentarily depressed, the interlocking circuit 43 for the relay 41 is broken at the contacts 35c, 35d while the motor circuit is completed at the contacts 35a, 35b. Simultaneously with the breaking of the interlocking circuit, the relay winding 41 is energized through the vacuum tube 39 to operate its movable contact element 41b to open the contacts 41b, 41d and to make contacts 41b, 41c and 41b, 41e. Thus the relay 41 completes the holding circuit for the motor 30 so that the push-button 35 need be depressed only momentarily.

Rotation of the motor 30 and its eccentric 30a causes an axial reciprocation of the collar 31 and, since the sleeve 32 is biased by the spring 34 to wedge the ball-bearings 33 into a driving engagement between the collar 31 and the shaft 24, the shaft 24 is "inched" to the right against the action of the biasing spring 27 in a series of rapid, minute, step-by-step movements. Movement of collar 31 to the left by the eccentric 30a releases the pressure of the collar 31 on the ball bearings 33 so that the shaft 24 is not driven to the left. The brake mechanism 26 is set during this operation and prevents reverse movement of the shaft 24 during the portion of the cycle of rotation of the eccentric 30a which effects adjustment of the collar 31 to the left in the direction of action of the spring 27. It will be noted that this type of a driving connection is effective to move the shaft 24 in only a single direction against the influence of the biasing spring 27.

As the receiver is tuned into a channel which is occupied by a station transmitting a signal of acceptable signal strength, the discriminator 14 is effective to develop at the terminal 14i a control signal. However, the polarity of connections of the elements of the discriminator 14 is such that, as the receiver is tuned toward a station in the direction of operation of the tuning apparatus, as described, the initial control signal is positive. This positive portion of the control signal developed by the discriminator 14 is effectively suppressed or short-circuited by the auxiliary diode 39a so that no appreciable control signal is applied to the grid of the control signal amplifier 39 until the receiver is tuned to the center of the channel occupied by the station in question. At this point the control signal increases very rapidly negatively along the conventional S-characteristic of the discriminator 14 so that, when the receiver is tuned only slightly through and beyond the center of the channel, the control signal impressed upon the grid of the tube 39 is sufficient to reduce its conductivity to the point that relay 41 is de-energized. Under these conditions the movable contact 41b is actuated by the biasing spring 41f to open the contacts 41b, 41c and interrupt the motor circuit so that the tuning apparatus is arrested at a point very close to the center of the channel of the station being received.

Simultaneously the contacts 41b, 41e are opened, thus opening the circuit 36 connected to the terminal 18a of the amplifier 18 and removing the quieting or muting bias therefrom. Simultaneously the contacts 41b, 41d of the relay 41 are closed again, completing the interlocking circuit 43 through the contacts 35*c*, 35*d* of the switch 35, contacts 41*b*, 41*d* of relay 41 and resistor 44 to the high-potential terminal of the relay winding 41*a*. This connection is effective to reduce the energization of the relay winding 41*a* to such a point that it will not respond upon the removal of the control bias from the tube 39, in case the signal from the received station should be interrupted for any reason. This interlocking arrangement avoids disturbing the setting of the receiver in case the station being received should interrupt its broadcasting only momentarily and further prevents an automatic retuning of the receiver in case it should be turned off and then turned on again while no signal was being received. Upon either of these conditions, it is necessary to depress the automatic tuning switch 35 again to initiate the cycle described above.

In case the tuning apparatus should operate, as described above, to its extreme right-hand position, as shown in the drawing, without receiving any signal of acceptable strength, the limit switch 48 is actuated as by the yoke 23 to close its contact 48*a* and thus energize the brake magnets 45 and 46 which are effective to move the sleeves 32 and $32_1$, respectively, to their right-hand positions and hold them in these positions, thus releasing both of the brakes 25 and 26. The spring 27 then acts through the line 28 to operate the shaft 24 and the associated tuning apparatus to its extreme lefthand position, as shown in the drawing, representing the high-frequency limit of the tuning range. The limit switch 48 remains closed until the tuning apparatus reaches its other extreme position, whereupon it is operated to open the contact 48*a* and de-energize the brake magnets 45 and 46 and the brakes are reset by their respective springs 34 and $34_1$.

In case it is desired to tune the receiver manually, the tuning knob 52 is depressed until the driving element 52*b* engages the driven element 50*a*, whereupon the drum 50 can be driven to actuate the tuning apparatus through the endless belt 49, the clamp 24*a* and the shaft 24 in a conventional manner. Upon the depression of the tuning knob 52, the switch contacts 55 are closed, thus energizing the brake magnets 45 and 46 to release the brakes 25 and 26, respectively, to permit the tuning apparatus to be freely adjusted by the tuning knob 52. It will be apparent that, in releasing the tuning knob 52 after a tuning operation, the switch contacts 55 must be opened before the driving element 52*b* disengages the driven element 50*a* to ensure that the brakes are reset before the manual driving connection to the tuning apparatus is interrupted.

Thus it is seen that by the invention there is provided a signal-seeking tuner which has the ease of tuning characteristic of conventional push-button tuning apparatus but requires no presetting of one or more manual push buttons.

While there has been described what is at present considered to be the preferred embodiment of the invention, it will be apparent to those skilled in the art that various changes and modifications may be made therein without departing from the spirit or scope of the invention.

What is claimed as new is:

1. An automatic signal-seeking tuner for a radio receiver comprising an adjustable tuning apparatus for the receiver, power means for actuating said tuning apparatus, manually operable means for initiating operation of said power means, means responsive to the reception of a signal by the receiver for arresting the actuation of said tuning apparatus, and interlocking means interconnecting said manually operable means and said signal-responsive means for limiting the latter to a single operation after each operation of said manually operable means.

2. An automatic signal-seeking tuner for a radio receiver comprising an adjustable tuning apparatus for the receiver, power means for actuating said tuning apparatus, manually operable means for initiating operation of said power means, means responsive to the reception of a signal by the receiver for arresting the actuation of said tuning apparatus, and interlocking means interconnecting said manually operable means and said signal-responsive means for rendering the latter non-responsive after a single operation until a subsequent operation of said manually operable means.

3. An automatic signal-seeking tuner for a radio receiver comprising, an adjustable tuning apparatus for the receiver, power means for actuating said tuning apparatus, manually operable means for initiating operation of said power means, means responsive to the reception of a signal by the receiver for arresting the actuation of said tuning apparatus, manually operable means engageable with said tuning apparatus for adjusting the same, and means actuated by engagement therebetween for freeing said tuning apparatus from actuation by said power means.

4. An automatic signal-seeking tuner for a radio receiver comprising, an adjustable tuning apparatus for the receiver, power means for actuating said tuning apparatus in only a single direction, manually operable means for initiating operation of said power means, a frequency discriminator network connected to translate a received signal for developing a control signal, means for suppressing the portion of said control signal developed during tuning toward a received signal, and means for utilizing said control signal for arresting the actuation of said tuning apparatus.

5. An automatic signal-seeking tuner for a radio receiver, comprising, an adjustable tuning apparatus for the receiver, electric motor means for actuating said tuning apparatus, a manually operable switch for initiating operation of said motor means, electrical means responsive to the reception of a signal by the receiver for arresting the actuation of said tuning apparatus, and an interlocking circuit interconnecting said switch and said electrical responsive means for limiting the latter to a single operation for each operation of said switch.

6. An automatic signal-seeking tuner for a radio receiver comprising, an adjustable tuning apparatus for the receiver, electric motor means for actuating said tuning apparatus, a manually operable switch including normally open contacts in circuit with said motor means and auxiliary contacts, electrical means responsive to the reception of a signal by the receiver and including normally open hold-in contacts in parallel with those of said switch, and an interlocking circuit interconnecting said auxiliary contacts of said switch and said electrical responsive means for limiting the latter to a single operation for each operation of said switch.

7. An automatic signal-seeking tuner for a radio receiver comprising, an adjustable tuning apparatus for the receiver, electric motor means for actuating said tuning apparatus, a manually operable switch including motor control contacts in circuit with said motor means and auxiliary normally closed contacts, electrical means responsive to the reception of a signal by the receiver and including hold-in contacts in circuit with said switch motor control contacts and normally closed interlock contacts, and an interlocking circuit interconnecting said normally closed contacts of said switch and said electrical responsive means for limiting said electrical responsive means to a single operation for each operation of said switch.

8. An automatic signal-seeking tuner for a radio receiver comprising, an adjustable tuning apparatus for the receiver, electric motor means for actuating said tuning apparatus, a manually operable switch for initiating operation of said motor means, electrical means responsive to the reception of a signal by the receiver for arresting the actuation of said tuning apparatus, and an interlocking circuit interconnecting said switch and said electrical responsive means for reducing the energization of said electrical responsive means below an operating value, thereby to limit the latter to a single operation for each operation of said switch.

WILLIAM L. DUNN.

REFERENCES CITED

The following references are of record in the file of this patent:

UNITED STATES PATENTS

| Number | Name | Date |
|---|---|---|
| 1,968,302 | Maurer | July 31, 1934 |
| 2,056,200 | Lowell | Oct. 6, 1936 |
| 2,099,719 | Banning | Nov. 23, 1937 |
| 2,326,738 | Andrews | Aug. 17, 1943 |
| 2,369,542 | Dietrich | Feb. 13, 1945 |

FOREIGN PATENTS

| Number | Country | Date |
|---|---|---|
| 351,934 | Great Britain | June 19, 1931 |